(12) United States Patent
Oganesian et al.

(10) Patent No.: US 8,796,135 B2
(45) Date of Patent: Aug. 5, 2014

(54) MICROELECTRONIC ELEMENTS WITH REAR CONTACTS CONNECTED WITH VIA FIRST OR VIA MIDDLE STRUCTURES

(75) Inventors: Vage Oganesian, Palo Alto, CA (US); Belgacem Haba, Saratoga, CA (US); Ilyas Mohammed, Santa Clara, CA (US); Craig Mitchell, San Jose, CA (US); Piyush Savalia, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 199 days.

(21) Appl. No.: 12/842,651

(22) Filed: Jul. 23, 2010

(65) Prior Publication Data

US 2012/0018863 A1 Jan. 26, 2012

(51) Int. Cl.
*H01L 21/4763* (2006.01)

(52) U.S. Cl.
USPC .......................... 438/620; 438/666; 438/672

(58) Field of Classification Search
USPC ........... 438/620, 666, 672; 257/686, 690, 698
See application file for complete search history.

(56) References Cited

U.S. PATENT DOCUMENTS

| | | | |
|---|---|---|---|
| 4,074,342 | A | 2/1978 | Honn et al. |
| 4,682,074 | A | 7/1987 | Hoeberechts et al. |
| 4,765,864 | A | 8/1988 | Holland et al. |
| 5,229,647 | A | 7/1993 | Gnadinger |
| 5,322,816 | A | 6/1994 | Pinter |
| 5,481,133 | A | 1/1996 | Hsu |
| 5,686,762 | A | 11/1997 | Langley |
| 5,700,735 | A | 12/1997 | Shiue et al. |
| 5,703,408 | A | 12/1997 | Ming-Tsung et al. |
| 5,808,874 | A | 9/1998 | Smith |
| 6,005,466 | A | 12/1999 | Pedder |

(Continued)

FOREIGN PATENT DOCUMENTS

| CN | 1490875 A | 4/2004 |
|---|---|---|
| CN | 1758430 A | 4/2006 |

(Continued)

OTHER PUBLICATIONS

David R. Lide et al: 'Handbook of Chemistry and Physics, 77th Edition, 1996-1997', Jan. 1, 1997, CRC Press, Boca Raton, New York, London, Tokyo, XP002670569, pp. 12-90-12-91.

(Continued)

*Primary Examiner* — Matthew Reames
*Assistant Examiner* — Farid Khan
(74) *Attorney, Agent, or Firm* — Lerner, David, Littenberg, Krumholz & Mentlik, LLP

(57) ABSTRACT

A microelectronic unit includes a microelectronic element, e.g., an integrated circuit chip, having a semiconductor region of monocrystalline form. The semiconductor region has a front surface extending in a first direction, an active circuit element adjacent the front surface, a rear surface remote from the front surface, and a conductive via which extends towards the rear surface. The conductive via can be insulated from the semiconductor region by an inorganic dielectric layer. An opening can extend from the rear surface partially through a thickness of the semiconductor region, with the opening and the conductive via having respective widths in the first direction. The width of the opening may be greater than the width of the conductive via where the opening meets the conductive via. A rear contact can be electrically connected to the conductive via and exposed at the rear surface for electrical connection with an external circuit element, such as another like microelectronic unit, a microelectronic package, or a circuit panel.

24 Claims, 10 Drawing Sheets

(56) References Cited

U.S. PATENT DOCUMENTS

| | | |
|---|---|---|
| 6,013,948 A | 1/2000 | Akram et al. |
| 6,022,758 A | 2/2000 | Badehi |
| 6,031,274 A | 2/2000 | Muramatsu et al. |
| 6,037,668 A | 3/2000 | Cave et al. |
| 6,103,552 A | 8/2000 | Lin |
| 6,143,369 A | 11/2000 | Sugawa et al. |
| 6,143,396 A | 11/2000 | Saran et al. |
| 6,169,319 B1 | 1/2001 | Malinovich et al. |
| 6,181,016 B1 | 1/2001 | Lin et al. |
| 6,261,865 B1 | 7/2001 | Akram |
| 6,277,669 B1 | 8/2001 | Kung et al. |
| 6,284,563 B1 | 9/2001 | Fjelstad |
| 6,313,024 B1 | 11/2001 | Cave et al. |
| 6,313,540 B1 | 11/2001 | Kida et al. |
| 6,362,529 B1 | 3/2002 | Sumikawa et al. |
| 6,368,410 B1 | 4/2002 | Gorczyca et al. |
| 6,399,892 B1 | 6/2002 | Milkovich et al. |
| 6,472,247 B1 | 10/2002 | Andoh et al. |
| 6,492,201 B1 | 12/2002 | Haba |
| 6,498,381 B2 | 12/2002 | Halahan et al. |
| 6,498,387 B1 | 12/2002 | Yang |
| 6,507,113 B1 | 1/2003 | Fillion et al. |
| 6,586,955 B2 | 7/2003 | Fjelstad et al. |
| 6,608,377 B2 | 8/2003 | Chang et al. |
| 6,638,352 B2 | 10/2003 | Satsu et al. |
| 6,693,358 B2 | 2/2004 | Yamada et al. |
| 6,716,737 B2 * | 4/2004 | Plas et al. .................. 438/612 |
| 6,727,576 B2 | 4/2004 | Hedler et al. |
| 6,737,300 B2 | 5/2004 | Ding et al. |
| 6,743,660 B2 | 6/2004 | Lee et al. |
| 6,812,549 B2 | 11/2004 | Umetsu et al. |
| 6,828,175 B2 | 12/2004 | Wood et al. |
| 6,864,172 B2 | 3/2005 | Noma et al. |
| 6,867,123 B2 | 3/2005 | Katagiri et al. |
| 6,873,054 B2 | 3/2005 | Miyazawa et al. |
| 6,879,049 B1 | 4/2005 | Yamamoto et al. |
| 6,914,336 B2 | 7/2005 | Matsuki et al. |
| 6,927,156 B2 | 8/2005 | Mathew |
| 6,982,475 B1 | 1/2006 | MacIntyre |
| 7,026,175 B2 | 4/2006 | Li et al. |
| 7,068,139 B2 | 6/2006 | Harris et al. |
| 7,091,062 B2 | 8/2006 | Geyer |
| 7,112,874 B2 | 9/2006 | Atlas |
| 7,271,033 B2 | 9/2007 | Lin et al. |
| 7,329,563 B2 | 2/2008 | Lo et al. |
| 7,413,929 B2 | 8/2008 | Lee et al. |
| 7,420,257 B2 | 9/2008 | Shibayama |
| 7,436,069 B2 | 10/2008 | Matsui |
| 7,446,036 B1 | 11/2008 | Bolom et al. |
| 7,456,479 B2 | 11/2008 | Lan |
| 7,531,445 B2 | 5/2009 | Shiv |
| 7,531,453 B2 | 5/2009 | Kirby et al. |
| 7,719,121 B2 | 5/2010 | Humpston et al. |
| 7,750,487 B2 | 7/2010 | Muthukumar et al. |
| 7,754,531 B2 | 7/2010 | Tay et al. |
| 7,767,497 B2 | 8/2010 | Haba |
| 7,781,781 B2 | 8/2010 | Adkisson et al. |
| 7,791,199 B2 | 9/2010 | Grinman et al. |
| 7,807,508 B2 | 10/2010 | Oganesian et al. |
| 7,829,976 B2 | 11/2010 | Kirby et al. |
| 7,901,989 B2 | 3/2011 | Haba et al. |
| 7,915,710 B2 | 3/2011 | Lee et al. |
| 7,935,568 B2 | 5/2011 | Oganesian et al. |
| 8,008,121 B2 | 8/2011 | Choi et al. |
| 8,008,192 B2 | 8/2011 | Sulfridge |
| 8,193,615 B2 | 6/2012 | Haba et al. |
| 8,253,244 B2 | 8/2012 | Kang |
| 8,263,434 B2 | 9/2012 | Pagaila et al. |
| 8,299,608 B2 | 10/2012 | Bartley et al. |
| 8,310,036 B2 | 11/2012 | Haba et al. |
| 8,405,196 B2 | 3/2013 | Haba et al. |
| 8,421,193 B2 | 4/2013 | Huang |
| 8,421,238 B2 * | 4/2013 | Inagaki .................. 257/774 |
| 2001/0048591 A1 | 12/2001 | Fjelstad et al. |
| 2002/0061723 A1 | 5/2002 | Duescher |
| 2002/0096787 A1 | 7/2002 | Fjelstad |
| 2002/0109236 A1 | 8/2002 | Kim et al. |
| 2002/0151171 A1 | 10/2002 | Furusawa |
| 2003/0059976 A1 | 3/2003 | Nathan et al. |
| 2003/0071331 A1 | 4/2003 | Yamaguchi et al. |
| 2003/0178714 A1 | 9/2003 | Sakoda et al. |
| 2004/0016942 A1 | 1/2004 | Miyazawa et al. |
| 2004/0017012 A1 | 1/2004 | Yamada et al. |
| 2004/0043607 A1 | 3/2004 | Farnworth et al. |
| 2004/0051173 A1 | 3/2004 | Koh et al. |
| 2004/0061238 A1 | 4/2004 | Sekine |
| 2004/0104454 A1 | 6/2004 | Takaoka et al. |
| 2004/0155354 A1 | 8/2004 | Hanaoka et al. |
| 2004/0173891 A1 | 9/2004 | Imai et al. |
| 2004/0178495 A1 | 9/2004 | Yean et al. |
| 2004/0188819 A1 | 9/2004 | Farnworth et al. |
| 2004/0188822 A1 | 9/2004 | Hara |
| 2004/0217483 A1 | 11/2004 | Hedler et al. |
| 2004/0222508 A1 | 11/2004 | Aoyagi |
| 2004/0251525 A1 | 12/2004 | Zilber et al. |
| 2004/0259292 A1 | 12/2004 | Beyne et al. |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0099259 A1 | 5/2005 | Harris et al. |
| 2005/0106845 A1 | 5/2005 | Halahan et al. |
| 2005/0148160 A1 | 7/2005 | Farnworth et al. |
| 2005/0156330 A1 | 7/2005 | Harris |
| 2005/0181540 A1 | 8/2005 | Farnworth et al. |
| 2005/0248002 A1 | 11/2005 | Newman et al. |
| 2005/0260794 A1 | 11/2005 | Lo et al. |
| 2005/0279916 A1 | 12/2005 | Kang et al. |
| 2005/0282374 A1 | 12/2005 | Hwang et al. |
| 2005/0287783 A1 | 12/2005 | Kirby et al. |
| 2006/0001174 A1 | 1/2006 | Matsui |
| 2006/0001179 A1 | 1/2006 | Fukase et al. |
| 2006/0017161 A1 | 1/2006 | Chung et al. |
| 2006/0043598 A1 | 3/2006 | Kirby et al. |
| 2006/0046348 A1 | 3/2006 | Kang |
| 2006/0046463 A1 | 3/2006 | Watkins et al. |
| 2006/0046471 A1 | 3/2006 | Kirby et al. |
| 2006/0055050 A1 | 3/2006 | Numata et al. |
| 2006/0068580 A1 | 3/2006 | Dotta |
| 2006/0071347 A1 | 4/2006 | Dotta |
| 2006/0076019 A1 | 4/2006 | Ho |
| 2006/0079019 A1 | 4/2006 | Kim |
| 2006/0094231 A1 | 5/2006 | Lane et al. |
| 2006/0115932 A1 | 6/2006 | Farnworth et al. |
| 2006/0154446 A1 | 7/2006 | Wood et al. |
| 2006/0175697 A1 | 8/2006 | Kurosawa et al. |
| 2006/0197216 A1 | 9/2006 | Yee |
| 2006/0197217 A1 | 9/2006 | Yee |
| 2006/0264029 A1 | 11/2006 | Heck et al. |
| 2006/0278898 A1 | 12/2006 | Shibayama |
| 2006/0278997 A1 | 12/2006 | Gibson et al. |
| 2006/0292866 A1 | 12/2006 | Borwick et al. |
| 2007/0035020 A1 | 2/2007 | Umemoto |
| 2007/0045779 A1 | 3/2007 | Hiatt |
| 2007/0052050 A1 | 3/2007 | Dierickx |
| 2007/0096295 A1 | 5/2007 | Burtzlaff et al. |
| 2007/0126085 A1 | 6/2007 | Kawano et al. |
| 2007/0194427 A1 | 8/2007 | Choi et al. |
| 2007/0231966 A1 | 10/2007 | Egawa |
| 2007/0249095 A1 | 10/2007 | Song et al. |
| 2007/0262464 A1 | 11/2007 | Watkins et al. |
| 2007/0269931 A1 | 11/2007 | Chung et al. |
| 2007/0290300 A1 | 12/2007 | Kawakami |
| 2008/0002460 A1 | 1/2008 | Tuckerman et al. |
| 2008/0020898 A1 | 1/2008 | Pyles et al. |
| 2008/0032448 A1 | 2/2008 | Simon et al. |
| 2008/0076195 A1 | 3/2008 | Shiv |
| 2008/0079779 A1 | 4/2008 | Cornell et al. |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0111213 A1 | 5/2008 | Akram et al. |
| 2008/0116544 A1 | 5/2008 | Grinman et al. |
| 2008/0136038 A1 | 6/2008 | Savastiouk et al. |

(56) References Cited

U.S. PATENT DOCUMENTS

| | | | |
|---|---|---|---|
| 2008/0150089 A1 | 6/2008 | Kwon et al. | |
| 2008/0157273 A1 | 7/2008 | Giraudin et al. | |
| 2008/0164574 A1 | 7/2008 | Savastiouk et al. | |
| 2008/0185719 A1 | 8/2008 | Cablao et al. | |
| 2008/0230923 A1 | 9/2008 | Jo et al. | |
| 2008/0246136 A1* | 10/2008 | Haba et al. | 257/686 |
| 2008/0274589 A1 | 11/2008 | Lee et al. | |
| 2008/0284041 A1 | 11/2008 | Jang et al. | |
| 2009/0008747 A1 | 1/2009 | Hoshino et al. | |
| 2009/0014843 A1 | 1/2009 | Kawashita et al. | |
| 2009/0026566 A1 | 1/2009 | Oliver et al. | |
| 2009/0032951 A1 | 2/2009 | Andry et al. | |
| 2009/0032966 A1 | 2/2009 | Lee et al. | |
| 2009/0039491 A1 | 2/2009 | Kim et al. | |
| 2009/0045504 A1 | 2/2009 | Suh | |
| 2009/0065907 A1 | 3/2009 | Haba et al. | |
| 2009/0085208 A1 | 4/2009 | Uchida | |
| 2009/0108464 A1* | 4/2009 | Uchiyama | 257/774 |
| 2009/0133254 A1 | 5/2009 | Kubota et al. | |
| 2009/0134498 A1 | 5/2009 | Ikeda et al. | |
| 2009/0148591 A1 | 6/2009 | Wang et al. | |
| 2009/0212381 A1 | 8/2009 | Crisp et al. | |
| 2009/0224372 A1 | 9/2009 | Johnson | |
| 2009/0243047 A1 | 10/2009 | Wolter et al. | |
| 2009/0263214 A1 | 10/2009 | Lee et al. | |
| 2009/0267183 A1 | 10/2009 | Temple et al. | |
| 2009/0267194 A1 | 10/2009 | Chen | |
| 2009/0283662 A1 | 11/2009 | Wu et al. | |
| 2009/0294983 A1 | 12/2009 | Cobbley et al. | |
| 2009/0309235 A1 | 12/2009 | Suthiwongsunthorn et al. | |
| 2010/0013060 A1 | 1/2010 | Lamy et al. | |
| 2010/0038778 A1 | 2/2010 | Lee et al. | |
| 2010/0105169 A1 | 4/2010 | Lee et al. | |
| 2010/0117242 A1 | 5/2010 | Miller et al. | |
| 2010/0127346 A1 | 5/2010 | DeNatale et al. | |
| 2010/0148371 A1 | 6/2010 | Kaskoun et al. | |
| 2010/0155940 A1* | 6/2010 | Kawashita et al. | 257/737 |
| 2010/0159699 A1 | 6/2010 | Takahashi | |
| 2010/0164062 A1 | 7/2010 | Wang et al. | |
| 2010/0167534 A1 | 7/2010 | Iwata | |
| 2010/0193964 A1 | 8/2010 | Farooq et al. | |
| 2010/0225006 A1 | 9/2010 | Haba et al. | |
| 2010/0230795 A1 | 9/2010 | Kriman et al. | |
| 2010/0258917 A1 | 10/2010 | Lin | |
| 2011/0089573 A1 | 4/2011 | Kurita | |
| 2011/0266674 A1 | 11/2011 | Hsia et al. | |
| 2012/0018863 A1 | 1/2012 | Oganesian et al. | |
| 2012/0018868 A1 | 1/2012 | Oganesian et al. | |
| 2012/0018893 A1 | 1/2012 | Oganesian et al. | |
| 2012/0018894 A1 | 1/2012 | Oganesian et al. | |
| 2012/0018895 A1 | 1/2012 | Oganesian et al. | |
| 2012/0025365 A1 | 2/2012 | Haba | |
| 2012/0068330 A1 | 3/2012 | Oganesian et al. | |
| 2012/0068352 A1 | 3/2012 | Oganesian et al. | |

FOREIGN PATENT DOCUMENTS

| | | |
|---|---|---|
| CN | 101675516 A | 3/2010 |
| CN | 201910420 U | 7/2011 |
| EP | 0316799 A1 | 5/1989 |
| EP | 0926723 A1 | 6/1999 |
| EP | 1482553 A2 | 12/2004 |
| EP | 1519410 A1 | 3/2005 |
| EP | 1551060 A1 | 7/2005 |
| EP | 1619722 A1 | 1/2006 |
| EP | 1653510 A2 | 5/2006 |
| EP | 1653521 A1 | 5/2006 |
| EP | 1686627 A1 | 8/2006 |
| JP | 60160645 A | 8/1985 |
| JP | 1106949 A | 4/1989 |
| JP | 4365558 A | 12/1992 |
| JP | 08-213427 A | 8/1996 |
| JP | 11016949 A | 1/1999 |
| JP | 11195706 A | 7/1999 |
| JP | 2001085559 A | 3/2001 |
| JP | 2001-217386 A | 8/2001 |
| JP | 2002016178 A | 1/2002 |
| JP | 2002162212 A | 6/2002 |
| JP | 2002217331 A | 8/2002 |
| JP | 2002373957 A | 12/2002 |
| JP | 2003318178 A | 11/2003 |
| JP | 2004165602 A | 6/2004 |
| JP | 2004200547 A | 7/2004 |
| JP | 2005026405 A | 1/2005 |
| JP | 2005093486 A | 4/2005 |
| JP | 2005101268 A | 4/2005 |
| JP | 2005209967 A | 8/2005 |
| JP | 2005216921 A | 8/2005 |
| JP | 2007053149 A | 3/2007 |
| JP | 2007157844 A | 6/2007 |
| JP | 2007317887 A | 12/2007 |
| JP | 2008-091632 A | 4/2008 |
| JP | 2008-177249 A | 7/2008 |
| JP | 2008227335 A | 9/2008 |
| JP | 2008-258258 A | 10/2008 |
| JP | 2010-028601 A | 2/2010 |
| KR | 19990088037 | 12/1999 |
| KR | 20040066018 A | 7/2004 |
| KR | 20060009407 A | 1/2006 |
| KR | 2006-0020822 A | 3/2006 |
| KR | 20070065241 A | 6/2007 |
| KR | 100750741 B1 | 8/2007 |
| KR | 20100087566 A | 8/2010 |
| TW | 200406884 A | 5/2004 |
| TW | 200522274 A | 7/2005 |
| TW | 200535435 A | 11/2005 |
| TW | 201025501 A | 7/2010 |
| WO | 03/025998 A2 | 3/2003 |
| WO | 2004114397 | 12/2004 |
| WO | 2008/054660 A2 | 5/2008 |
| WO | 2008108970 A2 | 9/2008 |
| WO | 2009017758 A2 | 2/2009 |
| WO | 2009023462 A1 | 2/2009 |
| WO | 2009104668 A1 | 8/2009 |
| WO | 2010104637 A1 | 9/2010 |

OTHER PUBLICATIONS

International Search Report and Written Opinion for Application No. PCT/US2011/029394 dated Jun. 6, 2012.

International Search Report and Written Opinion for Application No. PCT/US2011/060553 dated Oct. 26, 2012.

International Search Report and Written Opinion for PCT/US2011/051556 dated Feb. 13, 2012.

International Search Report and Written Opinion, PCT/US2011/063025, Mar. 19, 2012.

International Search Report Application No. PCT/US2011/029568, dated Aug. 30, 2011.

International Search Report Application No. PCT/US2011/029568, dated Oct. 21, 2011.

International Searching Authority, Search Report for Application No. PCT/US2011/060553 dated Jun. 27, 2012.

International Written Opinion for Application No. PCT/US2011/063653 dated Jan. 14, 2013.

Japanese Office Action for Application No. 2009-552696 dated Aug. 14, 2012.

Japanese Office Action for Application No. 2010-519953 dated Oct. 19, 2012.

Partial International Search Report for Application No. PCT/US2011/063653 dated Jul. 9, 2012.

Taiwan Office Action for Application No. 100113585 dated Jun. 5, 2012.

Partial International Search Report, PCT/US2008/002659, dated Oct. 17, 2008.

International Search Report, PCT/US2008/002659, dated Oct. 17, 2008.

International Search Report and Written Opinion, PCT/US2008/009356 dated Feb. 19, 2009.

International Search Report and Written Opinion, PCT/US2010/002318, dated Nov. 22, 2010.

(56) References Cited

OTHER PUBLICATIONS

International Search Report and Written Opinion, PCT/US2010/052458, dated Jan. 31, 2011.
Supplementary European Search Report, EP 08795005 dated Jul. 5, 2010.
International Search Report, PCT/US10/52783, Dated Dec. 10, 2010.
International Search Report and Written Opinion, PCT/US2010/052785, Dated Dec. 20, 2010.
International Search Report and Written Opinion for PCT/US2011/051552 dated Apr. 11, 2012.
Chinese Office Action for Application No. 201010546210.2 dated Aug. 21, 2013.
Chinese Office Action for Application No. 201010546793.9 dated Jun. 25, 2013.
Preliminary Examination Report from Taiwan Application No. 099140226 dated Oct. 21, 2013.
Taiwanese Office Action for Application No. 099143374 dated Jun. 24, 2013.

\* cited by examiner

MICROELECTRONIC ELEMENTS WITH REAR CONTACTS CONNECTED WITH VIA FIRST OR VIA MIDDLE STRUCTURES

BACKGROUND OF THE INVENTION

The present invention relates to packaging of microelectronic devices, especially the packaging of semiconductor devices.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 micron (μm) thick. The bond pads could include a single layer or multiple layers of metal. The size of the bond pads will vary with the device type but will typically measure tens to hundreds of microns on a side.

Through-silicon vias (TSVs) can be used to provide electrical connections between the front surface of a semiconductor chip on which bond pads are disposed, and a rear surface of a semiconductor chip opposite the front surface. Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via formation and interconnection, further improvements can be made to enhance the processes for making connections between front and rear chip surfaces, and to the structures which can result from such processes.

SUMMARY OF THE INVENTION

A microelectronic unit includes a microelectronic element, e.g., an integrated circuit chip, having a semiconductor region of monocrystalline form. The semiconductor region has a front surface extending in a first direction, an active circuit element adjacent the front surface, a rear surface remote from the front surface, and a conductive via which extends towards the rear surface. The conductive via can be insulated from the semiconductor region by an inorganic dielectric layer. An opening can extend from the rear surface partially through a thickness of the semiconductor region, with the opening and the conductive via having respective widths in the first direction. The width of the opening may be greater than the width of the conductive via where the opening meets the conductive via. A rear contact can be electrically connected to the conductive via and exposed at the rear surface for electrical connection with an external circuit element, such as another like microelectronic unit, a microelectronic package, or a circuit panel.

In one embodiment, a polymeric dielectric can be provided within the opening, and a conductive interconnect electrically connected with the rear contact and the conductive via and extending within at least the opening, the polymeric dielectric separating the conductive interconnect from the semiconductor region. In a particular embodiment, the conductive interconnect conforms to a contour of the opening.

In one embodiment, the conductive interconnect extends in a first direction between the conductive via and the rear contact, the first direction being at least substantially vertical, wherein vertical is Which is a direction of a thickness of the microelectronic element between the front and rear surfaces. In one embodiment, the polymeric dielectric can include an aperture extending in the first direction. A surface of the opening adjacent to the aperture can extend in a second direction towards the front surface, and the second direction can extend at an acute angle relative to the first direction.

In a particular embodiment, the conductive via includes a metal, which can be, for example, one or more of tungsten, copper, nickel, titanium, or aluminum. In one embodiment, at least a portion of the conductive via includes a polycrystalline semiconductor. In a particular embodiment, the width of the conductive via is not greater than 10 microns.

A front contact can be exposed at the front surface of the microelectronic element for electrical interconnecting the microelectronic element with an external circuit element. The front surface can extend in a second direction transverse to the first direction, and the conductive via can be electrically connected with the front contact. In one embodiment, at least one edge of the conductive via can be disposed beyond an edge of the front contact in at least one of the first or second directions.

The opening in the microelectronic element can include a first opening which extends from the rear surface, the first opening having a first width in the first direction, a second opening extending from the first opening towards the front surface. The second opening can have a second width which is smaller than the first width where the first and second openings meet. The conductive via can be exposed within the second opening, and the rear contact can be electrically connected with the conductive via through the first and second openings.

In one embodiment, the second width can be greater than the width of the conductive via. The second opening can be tapered to become smaller in a direction towards the front surface. The first opening can be tapered to become smaller in a direction towards the second opening.

In one embodiment, a plurality of the conductive vias can be exposed within the opening, and a plurality of the rear contacts are electrically connected with the conductive vias through the opening.

The microelectronic element may include a plurality of conductive traces electrically connected with the conductive vias and extending along at least one surface of the opening towards the rear contacts.

In one embodiment, the plurality of rear contacts can overlie the opening in the semiconductor region, and the microelectronic element may further include a plurality of conductive interconnects extending from the conductive vias to the rear contacts.

In a particular embodiment, a vertical direction can be a direction of a thickness of the microelectronic element between the front and rear surfaces, and the conductive interconnects can extend in the vertical direction between the conductive vias and the rear contacts.

In a particular embodiment, one or more other electronic components can be electrically connected to the microelectronic unit as described in one or more of the embodiments of the foregoing.

A system may further include a housing, wherein the structure and other electronic components can be mounted to the housing.

A method of fabricating a microelectronic unit is provided in accordance with an embodiment of the invention. In such embodiment, a microelectronic element can include a semiconductor region of monocrystalline form and having a front surface, and a rear surface remote from the front surface. An active circuit element can be disposed adjacent the front surface, a region including a sacrificial material can extend towards the rear surface. Processing can include removing at least a portion of the sacrificial material by processing applied through an opening extending from the rear surface and exposing the region. The sacrificial material may include polycrystalline semiconductor or tungsten, for example.

Processing can include forming a conductive region at least partially replacing the removed sacrificial material. In one embodiment, processing can include forming a rear contact electrically connected to the conductive region and exposed at the rear surface for electrical connection with a circuit element.

In one embodiment, the step of forming the opening may further include forming a first opening extending from the rear surface towards the front surface. A first layer may be formed within the first opening. Then, material of the semiconductor region can be removed through an opening in the first layer to form a second opening extending from the first opening toward the front surface.

In one embodiment, the step of forming the first layer can include forming a dielectric layer lining the first opening by electrochemically depositing a polymer onto an interior surface of at least the first opening.

In one example, photolithography can be used to define an extent and a location of the opening in the first layer. In a particular case, a laser can be used to define an extent and a location of the opening in the first layer.

The method may further include removing the first layer, then forming a dielectric layer on interior surfaces of the first and second openings. Then, conductive structure including the rear contact can be formed, the conductive structure being insulated from the semiconductor region by the dielectric layer.

In a particular embodiment, the step of removing removes the at least a portion of the sacrificial material by processing applied through the first and second openings. The microelectronic element may further include a dielectric region separating the sacrificial material region from the semiconductor region. The sacrificial material may include a polycrystalline semiconductor. The step of removing may remove at least a portion of the polycrystalline semiconductor, and the step of forming the conductive contact can include forming a conductive interconnect extending away from the conductive via at least within the opening, The rear contact can be electrically connected with the conductive interconnect.

In a particular embodiment, the dielectric region can include an inorganic dielectric material and the step of forming the dielectric layer can include depositing a polymeric material on at least an interior surface of the opening. The step of removing can remove the polycrystalline semiconductor material selectively with respect to the dielectric region.

In a particular embodiment, the polymeric material may be deposited electrochemically.

In a particular embodiment, the step of forming the rear contact includes forming a dielectric layer on at least an interior surface of the second opening and then filling at least the second opening with a conductive material.

In one example, the step of forming the rear contact can include forming a second dielectric layer within the second opening and then depositing a metal layer onto a surface of the second dielectric layer, the metal layer conforming to a contour of at least the second opening.

In accordance with one embodiment of the invention, a method is provided for fabricating a microelectronic element. The microelectronic element can include a semiconductor region of monocrystalline form and having a front surface extending in a first direction, an active circuit element adjacent the front surface, a front conductive contact exposed at the front surface, and a rear surface remote from the front surface. A conductive via including a metal can extend towards the rear surface. In one example, the conductive via can have an edge which is offset in a direction of the front surface beyond an edge of the front conductive contact.

The method can include forming an opening in the semiconductor region which extends from the rear surface exposes the conductive via. A rear contact can be formed which is electrically connected to the conductive via and exposed at the rear surface for electrical connection with a circuit element.

In one embodiment, the step of forming the opening can include forming a first opening extending from the rear surface towards the front surface. The opening can be lined with a first layer, then material of the semiconductor region can be removed through an opening in the first layer. In such way, a second opening can be formed which extends from the first opening toward the front surface.

In one example, a polymeric material can be deposited on at least an interior surface of the opening to form a dielectric layer prior to forming the rear contact. In a particular example, the polymeric material can be deposited electrochemically.

In one embodiment, the step of forming the first layer can include forming a dielectric layer lining the first opening by electrochemically depositing a polymer onto an interior surface of at least the first opening.

In one example, photolithography can be used to define an extent and a location of the opening in the first layer. Alternatively, a laser can be used to define an extent and a location of the opening in the first layer.

One embodiment provides removing the first layer. Then, a dielectric layer can be formed on interior surfaces of the first and second openings. Conductive structure including the rear contact can then be formed, the conductive structure being insulated from the semiconductor region by the dielectric layer.

In a particular embodiment, the step of forming the rear contact can include forming a dielectric layer on at least an interior surface of the second opening. The second opening, and possible, the first as well, can then be filled with a conductive material.

In one embodiment, the step of forming the rear contact can include forming a second dielectric layer within the second opening. A metal layer can be deposited onto a surface of the second dielectric layer. In a particular embodiment, the metal layer can conform to a contour of at least the second opening, or alternatively, can either fill the second opening or be provided as a post or other structure that does not conform to a contour of the opening.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

DETAILED DESCRIPTION

Figure 1:
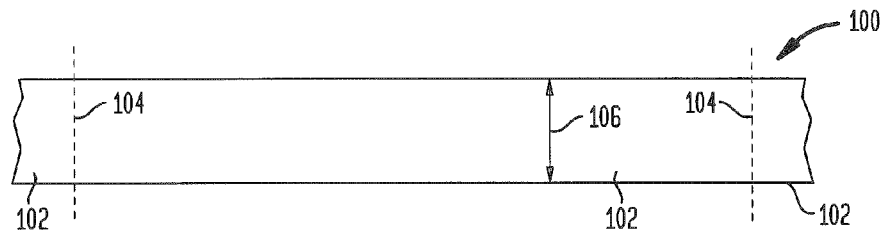
FIG. 1 is a sectional view illustrating a stage in a method of fabricating a microelectronic unit in accordance with an embodiment of the invention.

A monocrystalline semiconductor substrate, e.g., an intact wafer 100 or a portion of a wafer, is shown in FIG. 1. The wafer or wafer portion 100 is shown having a plurality of individual regions 102 which are attached to one another at peripheral edges 104 of each region 102. Through processing as further described, the regions 102 can become individual microelectronic elements, e.g., integrated circuit chips. Unless otherwise provided, processing as further described below is performed on a wafer or wafer portion which includes a plurality of regions attached to each other in this manner, either being referred to hereinafter as a "wafer".

Initially, the wafer 100 has a thickness 106 of several hundred microns. The wafer can consist essentially of silicon or a compound semiconductor material, for example, a III-V semiconductor compound such as gallium arsenide (GaAs) and the like, or a II-VI semiconductor compound.

Figure 2:
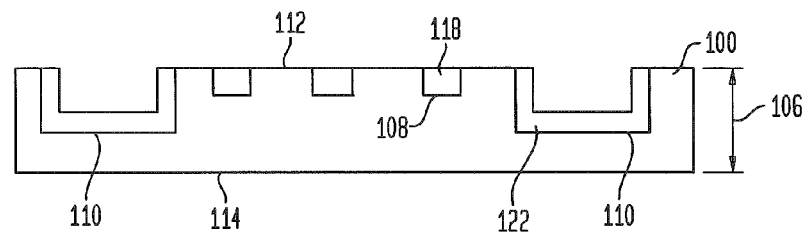
FIG. 2 is a sectional view illustrating a stage subsequent to the stage of FIG. 1 in a method of fabricating a microelectronic unit in accordance with an embodiment of the invention.

A "via first" flow will now be described with reference to FIG. 2 et seq. As seen in FIG. 2, trenches 108, 110 or "openings" are formed in the wafer from a front surface 112 of the wafer being a major surface, the trenches extending towards a rear surface 114 of the wafer which is remote from the front surface. The rear surface typically is a major surface of the wafer which is separated from the front surface in a direction of the thickness 106 of the wafer. Some of the trenches 108 are relatively shallow; e.g., typically extending to a depth of 70 to 500 nanometers from the front surface 112. Other trenches 110 typically extend to a depth ranging from about 300 nanometers to several microns or tens of microns. Generally, the trenches 110 extend to a greater depth than the trenches 108, such that when trenches 108 extend to a depth of 400 nanometers, for example, trenches 110 extend to depths greater than 400 nanometers.

As further seen in FIG. 2, the wafer can be processed to form isolation regions 118 in trenches 108 and to form a dielectric layer 122 in trenches 110. Isolation regions 118 typically can be formed by filling trenches 108 with an inorganic dielectric material such as an oxide, for example, silicon dioxide. The dielectric layer 122 can be provided by depositing an inorganic dielectric layer such as an oxide in trenches 110. In a particular example, the inorganic dielectric layer can include silicon oxide, silicon nitride, silicon oxynitride, or a combination of one or more thereof.

Figure 3:
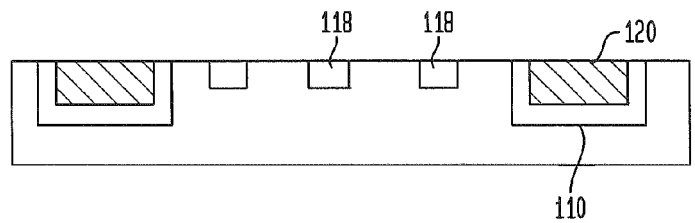
FIG. 3 is a sectional view illustrating a further stage in a method of fabricating a microelectronic unit in accordance with an embodiment of the invention.

FIG. 3 illustrates further processing in which regions of polycrystalline semiconductor material 120 are formed inside trenches 110. In one example, the polycrystalline semiconductor material is polycrystalline silicon, hereinafter "polysilicon", or "poly". In a particular example, in which the poly functions merely as a sacrificial layer, the poly may be provided as an intrinsic or lightly doped semiconductor material. In another example, particularly in cases where the poly forms part of a final conductive structure, the poly is heavily doped (e.g., at a dopant concentration of $5 \times 10^{18}$ cm$^{-3}$ to $10^{21}$ cm$^{-3}$) with an n-type dopant such as phosphorus or arsenic, among others, or a p-type dopant such as boron. The polysilicon can be deposited over the dielectric layer 122. After depositing the dielectric material and polysilicon, excess polysilicon and dielectric material which overlies the front surface 112 outside the trenches can be removed. For example, chemical mechanical polishing ("CMP") can be used to remove such layers above the front surface 112 while also planarizing surfaces of at least the filled trenches 118 with the front surface 112. Alternatively, instead of forming regions 120 of polysilicon, the regions can include a metal such as tungsten or titanium which is capable of withstanding subsequent processing used to form active circuit elements of the wafer.

Figure 4:
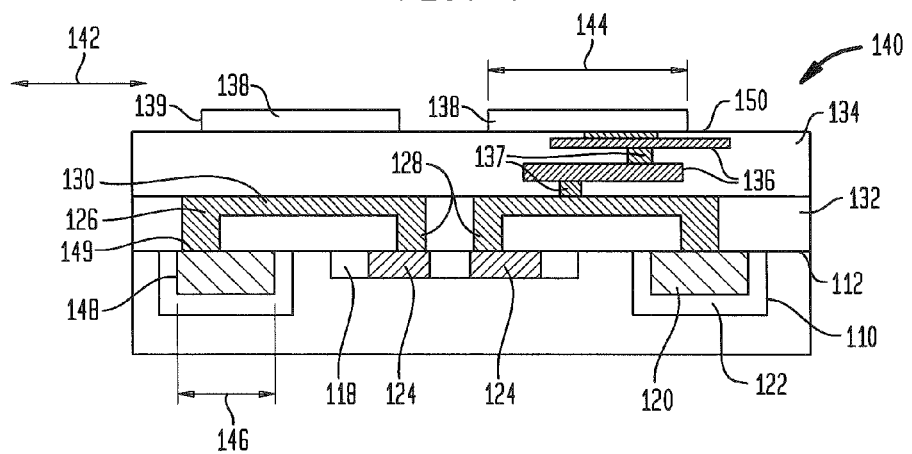
FIG. 4 is a sectional view illustrating a stage in a method of fabricating a microelectronic unit in accordance with an embodiment of the invention.

As seen in FIG. 4, further processing is performed to form active circuit elements 124, e.g., semiconductor devices, such as transistors, diodes, other devices, or combinations thereof, in monocrystalline semiconductor regions of the wafer 100. The active circuit elements can be electrically isolated from one another by isolation regions 118 and differences in the dopant type of the semiconductor regions of the active circuit elements 124 relative to portions of the wafer 100 adjacent thereto. The active circuit elements typically are separated from the highly doped polysilicon regions 120 of the wafer by the dielectric layer 122 which lines trenches 110. Processing forms the active circuit elements typically either after, or simultaneously when forming the isolation regions 118 and polysilicon regions 120. In view of this, the polysilicon regions 120 need to withstand high processing temperatures typically above 600° C., and possibly as high as 1400° C. used in forming the active circuit elements, such as used for driving a dopant into various semiconductor regions of the active circuit elements.

After forming the active circuit elements, a dielectric layer 132 is formed atop the front surface 112 of the monocrystalline wafer 100. Contact vias 126, 128 are formed which extend through the dielectric layer and electrically contact the polysilicon regions 120 and the active circuit elements 124, respectively. The contact vias can include a polycrystalline semiconductor material, a metal, an alloy of a metal, for example, a silicide, a conductive compound of a metal, or a combination thereof. In a particular embodiment, the contact vias 126, 128 can include a refractory metal, for example, tungsten, titanium, or a combination thereof. These metals can be deposited by physical vapor deposition ("PVD"), sputtering or by chemical vapor deposition ("CVD"). Like polysilicon, tungsten and titanium also withstand subsequent high temperature processing.

FIG. 4 further illustrates metal lines 130 which electrically connect the active circuit elements with the polysilicon regions 120. For illustrative purposes, the metal lines 130 are shown connecting the contact vias 126 with the contact vias 128. However, the metal lines need not directly connect the contact vias 126, 128. For example, the metal lines which connect the polysilicon regions 120 with the active circuit elements 124 can be provided in higher level metal layers disposed in higher dielectric layers (not shown) which are farther removed from the major surface 112 than dielectric layer 132 through which the contact vias 126, 128 are formed.

A further dielectric layer 134 overlies dielectric layer 132 and one or more dielectric layers (not shown) disposed between the dielectric layers 132, 134 in which additional layers of metal wiring lines 136 and vias 137 can be provided. These metal wiring lines 136 and vias 137 can electrically connect one of more of the polysilicon regions 120 with the corresponding front contact 138 through the wiring lines 130 and vias 126. Conductive contacts 138, e.g., metal pads, posts, or a combination of posts and pads, can be exposed at an exposed front surface 150 of the wafer 140 after the foregoing processing. The contacts 138 can be electrically connected with some or all of the polysilicon regions, e.g., by a combination of vias and metal lines (not shown) which can extend from the metal lines 130 within higher level dielectric layers (not shown) and dielectric layer 134 to the contacts 138. The conductive contacts 138 have lateral dimensions 144 extending in a lateral direction 142 of the wafer, the lateral dimensions 144 being larger than corresponding lateral dimensions 146 of the polysilicon regions in the same direction 142. As seen in FIG. 4, the conductive contacts 138 need not be aligned with the polysilicon regions 120. Moreover, a peripheral edge 148 of a polysilicon region 120 can be disposed beyond a nearest peripheral edge 139 of a contact. It may even be that a particular contact 138 of the wafer does not overlie and does not even partially overlie a major surface 149 of any polysilicon region 120 of the wafer.

Figure 5:
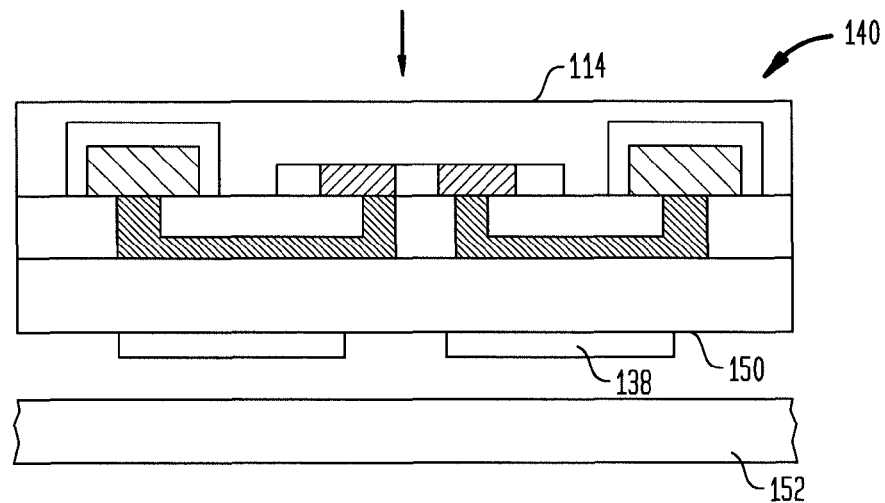
FIG. 5 is a sectional view illustrating a stage in a method of fabricating a microelectronic unit in accordance with an embodiment of the invention.

FIG. 5 illustrates a subsequent stage of processing in which the thickness of the wafer 140 can be reduced prior to further processing for forming rear conductive contacts, as further described below. In one example, the thickness of the wafer 140 can be reduced by grinding or lapping from the rear surface 114. In one embodiment, the final thickness of the wafer 140 after grinding or lapping is reduced to a few tens of microns to 100-200 microns. In a particular embodiment, the final thickness may be less than 10 microns. Optionally, during the grinding or lapping process, the exposed front surface 150 of the wafer 140 (i.e., the surface at which the contacts 138 are exposed) can be clamped to a chuck (not shown) or affixed to a carrier substrate 152, such as through an adhesive to support the wafer 140.

Figure 6:
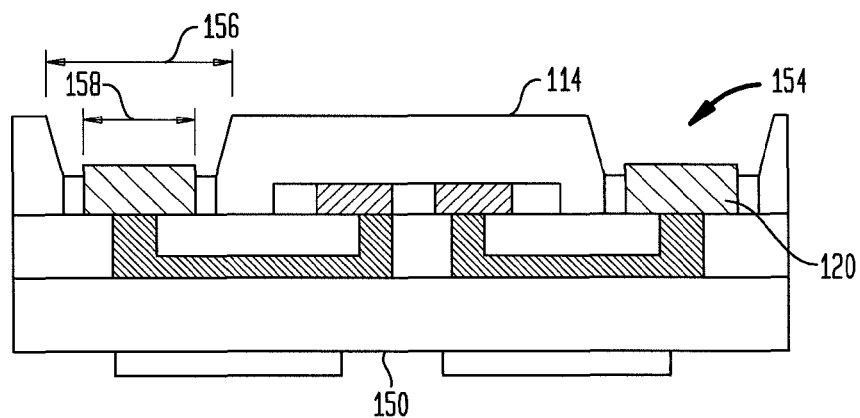
FIG. 6 is a sectional view illustrating a stage in a method of fabricating a microelectronic unit in accordance with an embodiment of the invention.

Then, as illustrated in FIG. 6, openings 154 can be formed which extend from the rear surface 114 towards the front surface 150 of the wafer 140. The openings 154 can be formed by any one or a combination of several methods. The openings can be formed by removing at least a portion of the monocrystalline semiconductor material between the rear surface and the polysilicon regions 120, as well as a portion of the dielectric layer 122 which lines the polysilicon regions. In particular examples, the openings 154 can be formed by laser ablation, mechanical milling, etching, or by directing a stream of abrasive particles towards the rear surface 114 of the wafer. In one embodiment, the openings 154 can be formed by one or more of the techniques described therefor in commonly owned co-pending U.S. application Ser. No. 12/842,612 filed Jul. 23, 2010, the disclosure of which is incorporated herein by reference.

Typically, a width 156 of the opening in a lateral direction 142 of the wafer 140 is greater than a width 158 of the polysilicon region 120 in the same lateral direction. The width 156 typically is the small dimension of the opening 154 in first and second directions parallel to the planes in which the front and rear surfaces 150, 114 extend.

Figure 7:
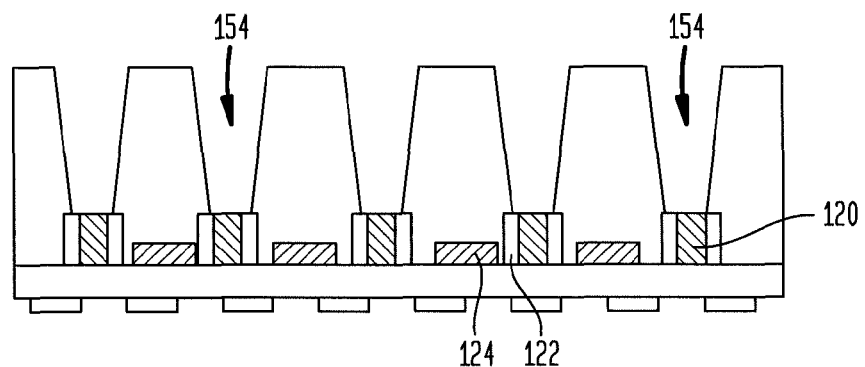
FIG. 7 is a sectional view illustrating a stage in a method of fabricating a microelectronic unit in accordance with an embodiment of the invention.

FIG. 7 provides an alternative view of the assembly shown in FIG. 6 in which features have been magnified to a smaller extent than in FIG. 6, so as to bring into view a greater number of the polysilicon regions 120, active circuit elements 124 and openings 154 from the rear surface which expose at least some polysilicon regions 120. As also seen in FIG. 7, a portion of dielectric layer 122 separates the polysilicon region from an adjacent region in which an active circuit element 124 is formed.

Figure 8:
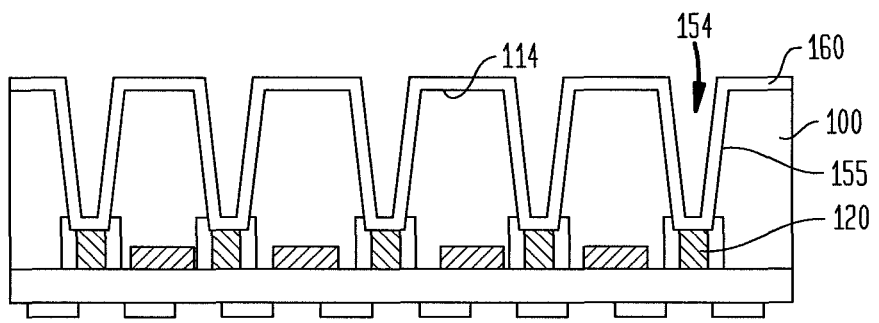
FIG. 8 is a sectional view illustrating a stage in a method of fabricating a microelectronic unit in accordance with an embodiment of the invention.

Thereafter, as seen in FIG. 8, a dielectric layer 160 can be formed on the rear surface 114 and within openings 154. The dielectric layer 160 can include any of a variety of types of dielectric materials which can be inorganic or polymeric in composition. In a particular embodiment, the dielectric layer 160 includes a polymeric material. Various methods can be used to form the dielectric layer 160. In one example, a flowable dielectric material is applied to the rear surface 114 of a wafer 100 and the flowable material is then more evenly distributed across the rear surface of the wafer during a "spin-coating" operation, followed by a drying cycle which may include heating. In another example, a thermoplastic film of dielectric material can be applied to the rear surface 114 of the wafer 100 after which the assembly including the wafer and lid element is heated, causing the film to flow downward into the openings 154. In another example, vapor deposition can be used to form the dielectric layer.

In still another example, the wafer 100 can be immersed in a dielectric deposition bath to form a conformal dielectric coating or layer 160. An electrochemical deposition such as electrophoretic or electrolytic deposition can be used to form the conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrochemically deposited conformal dielectric coating 160 on exposed surfaces of the device wafer which are conductive or semiconductive, including but not limited to along the rear face 114, and walls 155 of the openings 154, and surfaces of the regions of sacrificial material, e.g., polysilicon or tungsten, etc. Electrophoretic deposition occurs so long as a sufficiently strong electric field is maintained between the surface to be coated thereby and the bath. Electrolytic deposition can be continued even after a strong electric field is no longer present. An electrophoretically deposited coating is self-limiting in that after it reaches a certain thickness governed by parameters, e.g., voltage, concentration, etc. of its deposition, deposition stops. Electrophoretic deposition forms a continuous and uniformly thick conformal coating on conductive and/or semiconductive exterior surfaces of the assembly. In addition, the electrophoretically deposited coating typically does not form on existing dielectric layers which can be present, due to its dielectric (nonconductive) property. Stated another way, a property of electrophoretic deposition is that is does not form on a layer of dielectric material overlying a conductor provided that the layer of dielectric material has sufficient thickness, given its dielectric properties. Typically, electrophoretic deposition will not occur on dielectric layers having thicknesses greater than about 10 microns to a few tens of microns.

In one embodiment, the conformal dielectric layer 160 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C) | 5.5-5.9 | 7-9 | 4.3 |
| CONDUCTIVITY (25 C.) μS | 450-600 | 500-800 | 400-800 |

TABLE 1-continued

| ECOAT NAME | POWERCRON 645 | POWERCRON 648 | CATHOGUARD 325 |
|---|---|---|---|
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |
| APPLICATION DATA | | | |
| Pb/Pf-free | Pb-free | Pb or Pb-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |
| Pb/Pf-free | | Pb-free | Pb-free |
| HAPs, g/L | | | |
| VOC, g/L (MINUS WATER) | | | |

Figure 9:
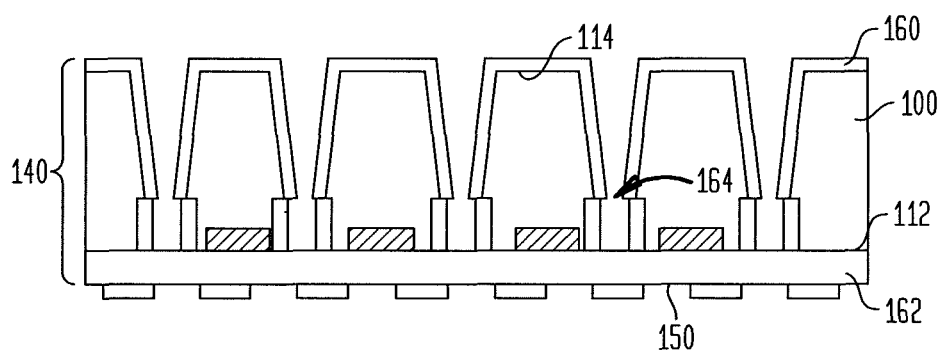
FIG. 9 is a sectional view illustrating a stage in a method of fabricating a microelectronic unit in accordance with an embodiment of the invention.

Thereafter, as seen in FIG. 9, openings 164 are formed in the polymeric layer 160 to expose the polysilicon regions from within each opening. In one embodiment, photolithography can be used to define an extent and a location of an opening 164 in the polymeric layer 160. In another embodiment, a laser can be used to define the extent and location of an opening 164. The polysilicon within each polysilicon region 120 (FIG. 8) can now be removed, such as by etching the polysilicon therein selectively relative to other materials of wafer 140, i.e., a dielectric layer, e.g., an inorganic dielectric such as an oxide layer 122 which surrounds each polysilicon region. The polysilicon etch can also be performed selectively with respect to other dielectric materials such as layer 162, e.g., an oxide or other material disposed between the front major surface 112 of the monocrystalline semiconductor region 100 and the exposed front surface 150 of the wafer. When the material in region 120 is a material other than a polycrystalline semiconductor, such as tungsten, for example, the tungsten can be removed by etching or other processing applied through the opening 164 in the dielectric layer.

Figure 10:
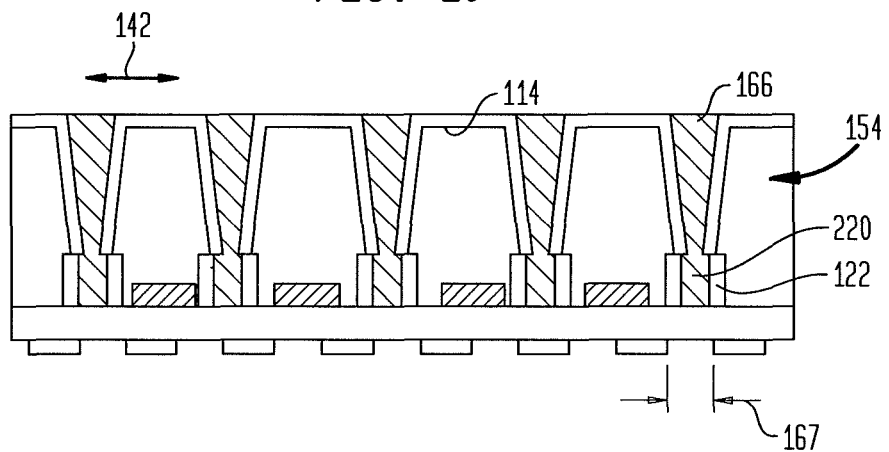
FIG. 10 is a sectional view illustrating a stage in a method of fabricating a microelectronic unit in accordance with an embodiment of the invention.

Thereafter, as illustrated in FIG. 10, in one embodiment, a metal 166 layer can be formed in the openings and in the places formerly occupied by the polysilicon regions. In one example, the metal can be deposited into the openings and onto a rear surface 114 of the wafer 140 such as by a plating process, after which excess metal overlying the rear surface 114 can be removed. Illustratively, a metal such as copper, nickel, aluminum, or a combination thereof can be included in the metal layer. One or more other layers of metal, metal alloys or conductive metal compounds can be provided as a catalyst material, seed layer, for adhesion with the dielectric layer, or as a barrier metal layer, such as for use in avoiding movement of ions between the metal layer and an adjacent dielectric layer. In some cases, tungsten, titanium, or both can fill the role of some of these additional metal layers. With the dielectric layer 122 still in place after removing polysilicon from therein, the metal which replaces the material removed from the polysilicon regions can be referred to as a "conductive via" 220. The width 167 of each conductive via in a direction 142 of the plane of the rear surface 114 of the wafer illustratively is less than 10 microns.

Figure 11:
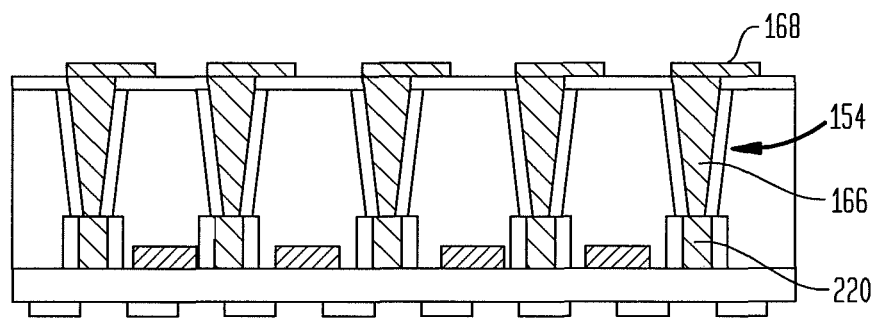
FIG. 11 is a sectional view illustrating a stage in a method of fabricating a microelectronic unit in accordance with an embodiment of the invention.

A subsequent plating process can then be used to form rear contacts 168, e.g., conductive pads, exposed at the rear surface 114 of the wafer, as seen in FIG. 11. Alternatively, when a metal layer is formed over the rear surface during the process of forming the metal layer 166 within the openings, that metal layer can be patterned or augmented to form the rear contacts 168. A portion of the metal layer 166 which extends within at least the opening 154 away from the conductive via 220 and connected to the contact 168 can be considered a "conductive interconnect". As particularly seen in FIG. 11A, each opening 154 can contain a single metal layer 166 therein which is electrically connected with a rear contact 168 exposed at the rear surface 114. However, other arrangements are possible, as will be described below with respect to FIGS. 19, 20 and 21.

Figure 12:
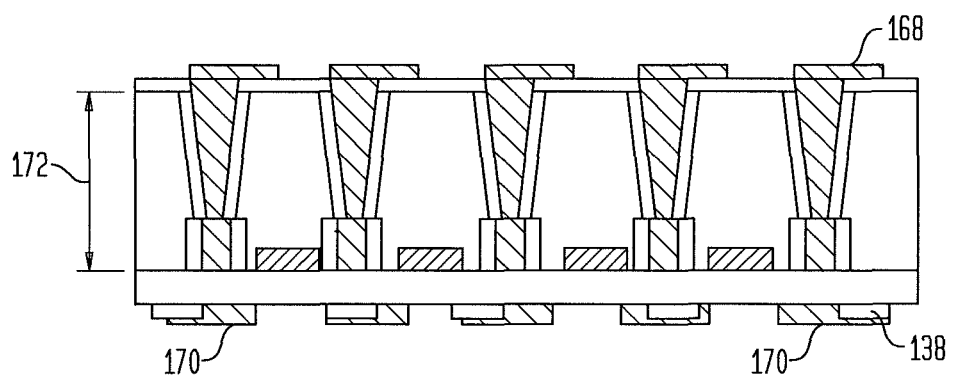
FIG. 12 is a sectional view illustrating a stage in a method of fabricating a microelectronic unit in accordance with an embodiment of the invention.

As also seen in FIG. 12, optionally a redistribution layer (RDL) 170 can be formed in contact with the front contacts 138, e.g., conductive metal pads of the wafer, such as by plating a metal thereon. The RDL can be formed optionally to form bond pad extensions, traces or additional conductive pads which are substantially in vertical alignment (i.e., in vertical direction 172) with the rear contacts 168. In such case, a multiple-wafer assembly 180 can be formed by electrically connecting the front conductive contacts 138 of one wafer 140A with the rear contacts 168 of another wafer 140B. In one example, the contacts 138, 168 can be joined through the RDL 170 with a bonding layer 174 between at least the RDL and the rear contacts 168, the bonding layer 174 including a bond metal, e.g., tin, solder, conductive paste, anisotropic conductive adhesive or other conductive joining material. Alternatively, in other examples, the contacts 138, 168 can be electrically connected together through another joining technique such as thermocompression bonding, diffusion bonding or other technique.

Figure 13:
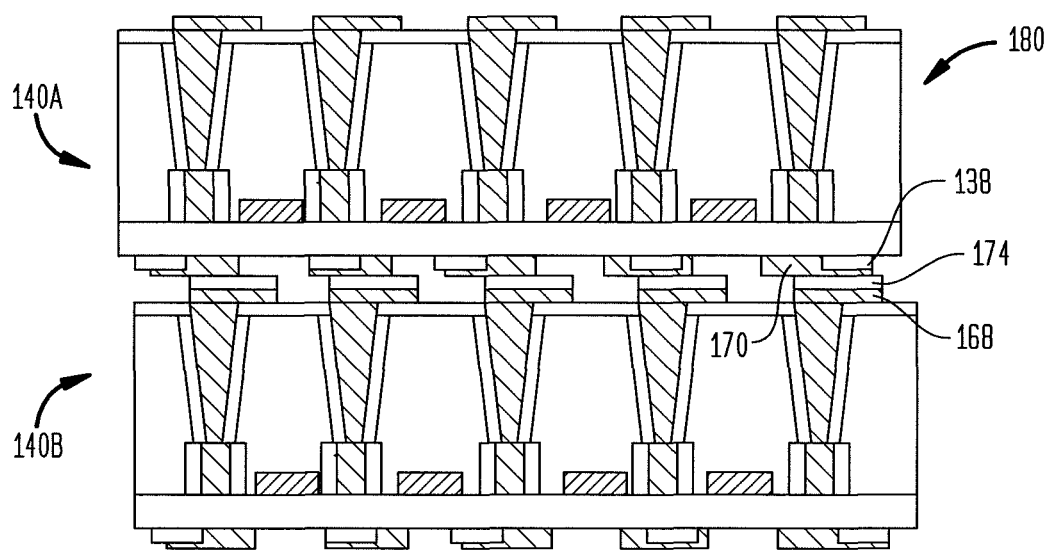
FIG. 13 is a sectional view illustrating a stage in a method of fabricating a stacked microelectronic assembly in accordance with an embodiment of the invention.
Figure 14:
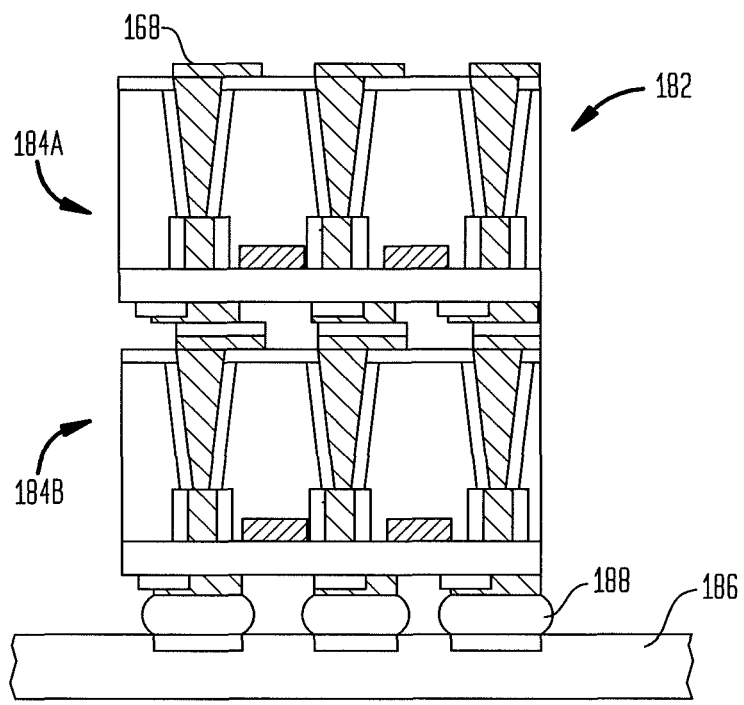
FIG. 14 is a sectional view illustrating a structure and interconnection of a stacked microelectronic assembly in accordance with an embodiment of the invention.

FIG. 14 illustrates a further stage in which a multi-wafer assembly 180 (FIG. 13) can be severed along dicing lanes of the microelectronic elements, e.g., integrated circuit chips, therein to form a stacked microelectronic unit 182 which contains units 184A, 184B being severed portions of each wafer 140A, 140B (FIG. 13). The microelectronic unit 182 can now be electrically joined to a circuit panel 186 or to other circuit elements through the exposed front contacts 138 or RDL layer 170 and bond metal 188. Alternatively, the microelectronic unit 182 can be joined to a circuit panel in a similar manner by way of the rear contacts 168 of unit 184A and a bond metal therebetween.

Figure 15:
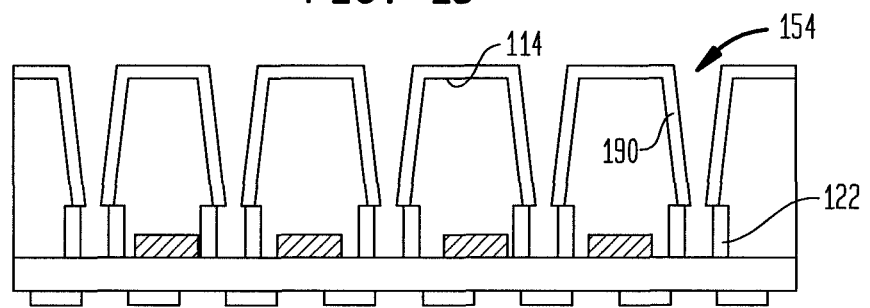
FIG. 15 is a sectional view illustrating a stage in a method of fabricating a microelectronic unit in accordance with an embodiment of the invention.

As seen in FIG. 15, in a variation of the process described above relative to FIGS. 8 and 9, a sacrificial layer 190 of material such as a photoresist layer or other material is applied within the openings 154 and on the rear surface 114. Openings are then formed in the sacrificial layer 190 which expose the polysilicon regions. Portions of the polysilicon regions, or the polysilicon material then can be completely removed through the openings in the sacrificial layer 190, such as, for example, by etching the polysilicon in a manner which is selective relative to the other materials, e.g., the sacrificial layer 190 and a dielectric layer 122 which are exposed to the etchant.

Figure 16:
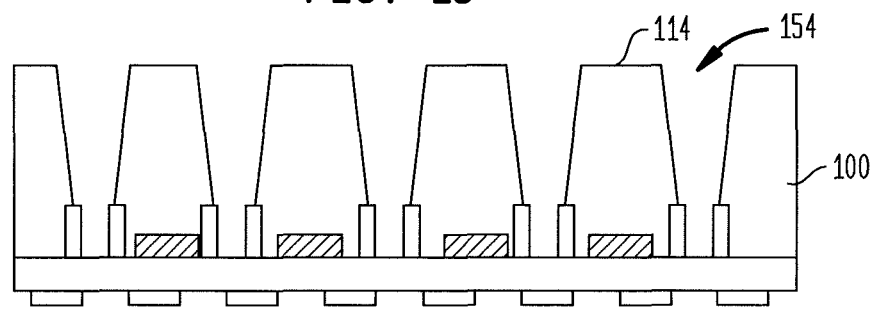
FIG. 16 is a sectional view illustrating a stage in a method of fabricating a microelectronic unit in accordance with an embodiment of the invention.
Figure 17:
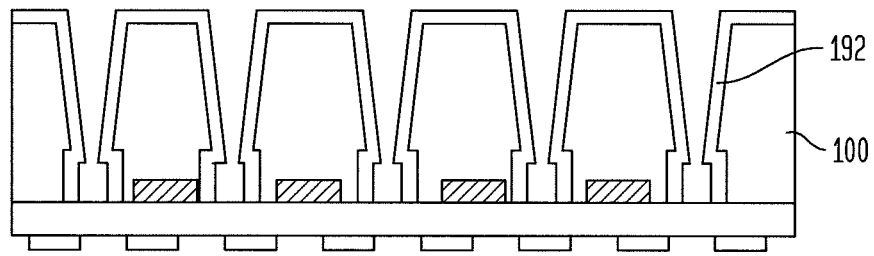
FIG. 17 is a sectional view illustrating a stage in a method of fabricating a stacked microelectronic assembly in accordance with an embodiment of the invention.

Thereafter, as illustrated in FIG. 16, the sacrificial layer 190 can be removed from the openings 154 and the rear surface 114 of the semiconductor region 100, after which dielectric layer 192 (FIG. 17) can be formed to overlie exposed surfaces of the semiconductor region 100. Processing then resumes with the formation of a metal layer 166 as described above with respect to FIG. 10.

Figure 18:
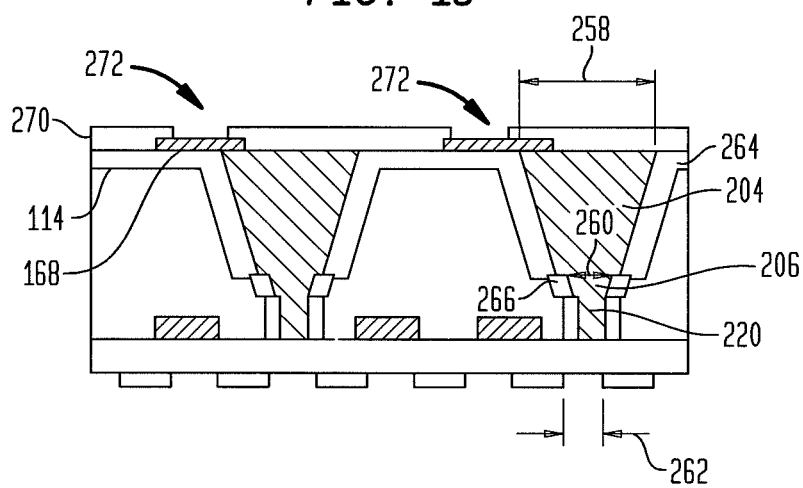
FIG. 18 is a sectional view illustrating a structure of microelectronic unit in accordance with an embodiment of the invention.

FIG. 18 illustrates a variation of the above-described embodiment (FIGS. 6-11) in which the opening which extends from the rear surface is a staged opening in which a first opening 204 extends from the rear surface 114 towards the front surface, and then a second opening 206 extends from within the first opening towards the front surface so as to expose the sacrificial region 220. In one embodiment, certain aspects of the openings and aspects of dielectric or conductive structures accompanying the openings can be as described in U.S. application Ser. No. 12/072,508 filed Feb. 26, 2008 and Ser. No. 12/784,841 filed May 21, 2010, the disclosures of these applications being incorporated by reference herein. In one embodiment, a maximum width 258 of the first opening, such as at the rear surface 114, is greater than a maximum width 260 of the second opening. In addition, the maximum width 260 can be greater than a maximum width 262 of the conductive via which results after replacing the removed polysilicon material in region 220 with the metal as shown and described above with respect to FIG. 10. As seen in FIG. 18, the first opening 204 can be tapered to become smaller in a direction towards the front surface, which is also in a direction towards the second opening 206. The second opening 206 can also be tapered to become smaller in a direction towards the front surface. As further shown in FIG. 18, a dielectric layer 264 which lines the first opening can be the same layer or a different layer from the dielectric layer 266 which lines the second opening. Illustratively, a solder mask 270 can overlie portions of the rear surface 114, the rear contacts 168 being exposed within openings 272 of the solder mask.

Figure 19:
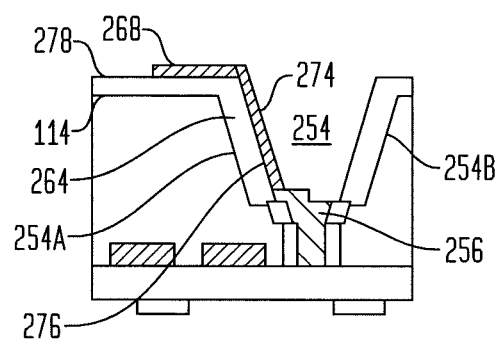
FIG. 19 is a sectional view illustrating a structure of microelectronic unit in accordance with a variation of an embodiment of the invention shown in FIG. 18.

FIG. 19 illustrates another variation of the above-described embodiment (FIGS. 6-11) in which a conductive interconnect 274 extends along dielectric layer 264 and onto rear surface 114 where it electrically connects with the rear contact 268. In one embodiment, the rear contact 268 can be formed integrally with the conductive interconnect 274, e.g., as parts of the same metal layer or set of metal layers which are formed simultaneously on exposed surfaces 276, 278 of the dielectric layer 264 within opening 254 and over the rear surface 114. As illustrated in FIG. 19, the conductive interconnect extends along a first wall 254A of the opening, but not along a second wall 254B thereof. In one embodiment, the conductive interconnect can conform to a contour of a wall 254A of the opening 254 over which it lies. In one embodiment, the conductive interconnect 274 can be the only conductive element extending within the first opening and can extend from a single conductive via exposed thereto, e.g., through second opening 256.

Figure 20:
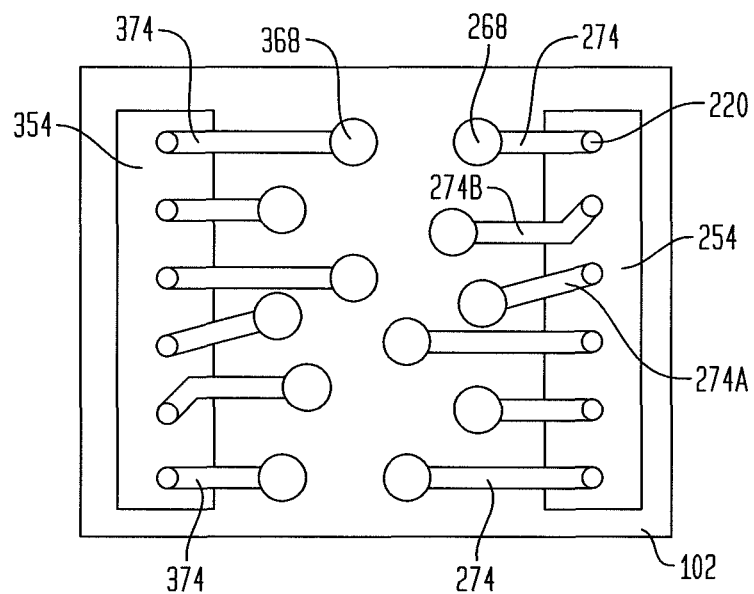
FIG. 20 illustrates a top-down plan view corresponding to the sectional view of FIG. 19 of a microelectronic unit in accordance with an embodiment of the invention.
Figure 21:
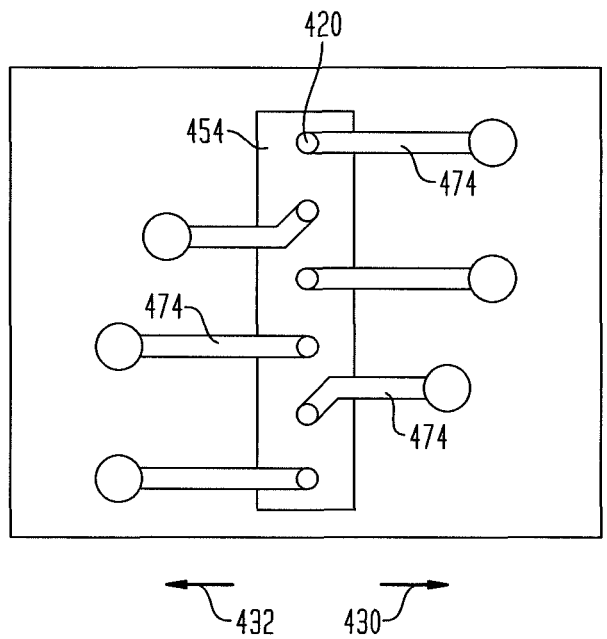
FIG. 21 illustrates a top-down plan view corresponding to the sectional view of FIG. 19 of a variation of the microelectronic unit shown in FIG. 20, in accordance with an embodiment of the invention.

Alternatively, as seen in FIG. 20, the conductive interconnect 274 and other conductive interconnects 274 can be provided as a plurality of conductive traces which overlie interior surfaces of a relatively large opening 254 to which a number of conductive vias 220 are exposed either directly or through corresponding second openings between the vias and the first opening. In addition, a microelectronic element 102 of the wafer can have more than one first opening therein. For example, a plurality of conductive interconnects 374 (FIG. 20) can extend along one or more interior surfaces of another first opening 354 which extends from the rear surface towards the front surface, the conductive interconnects 374 being electrically connected with rear contacts 368 overlying the rear surface. As illustrated in FIG. 20 the conductive interconnects 274 can extend in a directions which are up the sloped wall of the opening between the conductive vias and the rear contacts. Alternatively, one or more of the conductive interconnects, such as interconnects 274A, 274B, can extend in directions which are partly up the sloped wall and partly in a direction along the sloped wall. In one particular embodiment, the conductive interconnects can be formed in a manner such as the conductive elements, e.g., traces are formed as described in commonly owned U.S. application Ser. No. 12/842,669 filed Jul. 23, 2010, the disclosure of which is incorporated by reference herein. In another variation, a single opening 454 (FIG. 21) may be provided, from which conductive interconnects 474 extend in multiple directions. In one example, the integrated circuit chip can be a dynamic random access memory ("DRAM") chip having a plurality of conductive vias 420 to which the conductive interconnects 474 can be connected directly or indirectly by way of second openings, for example. As seen in FIG. 21, some of the conductive interconnects 474 can extend in a first direction 430 from conductive vias 420, while other conductive interconnects 474 extend in a second direction 432 from conductive vias 420.

Figure 22:
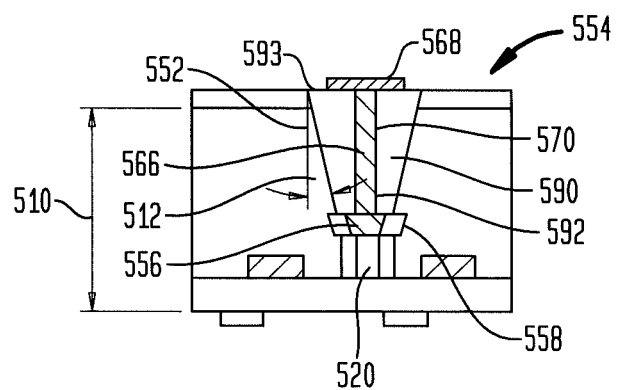
FIG. 22 is a sectional view illustrating a structure of microelectronic unit in accordance with a variation of an embodiment of the invention shown in FIG. 18.

FIG. 22 illustrates a particular variation in which the rear contact 568 is provided as a conductive pad overlying a region 590 of dielectric material which fills the opening 554. In this case, the rear contact 568 can be connected with the conductive via through a metal post which extends through an aperture 592 extending through the dielectric region 590. In one exemplary embodiment, after forming dielectric layer 558, the conductive via 520 and the metal layer 556 within the second opening, a dielectric region 590 is formed of polymeric material by filling the first opening. Then, an aperture can be formed in the dielectric region, such as by laser ablation, mechanical milling, or other technique. A metal layer then can be formed in the aperture to form the post 566.

In a particular embodiment, the aperture can have a wall 570 which extends in a vertical direction 510, i.e., a normal direction with respect to the front surface 112 of the monocrystalline semiconductor region 100. In such case, the post 566 formed therein extends in the vertical direction 510 between the conductive via 520 and surface 593 on which a conductive contact 568 is provided. Such wall 570 extends in a different direction from, and at an acute angle 512 with respect to the wall 552 of the opening 554. In another embodiment, the wall 570 of the aperture might not extend in a vertical direction, but nevertheless extends at an acute angle 512 with respect to a direction in which the wall 552 of the opening 554 extends.

In one embodiment, the post 566 can be a hollow tube-like structure having a central opening; in another embodiment, the post can be solid, i.e., without having an opening therein. After forming the post, a conductive pad can be formed atop the post as the rear contact. In another embodiment, the conductive pad can be omitted. In such case, the exposed end of the post can either extend above the surface 593 of the dielectric region, be co-planar with the surface 593, or be recessed somewhat below the surface 593.

Figure 23:
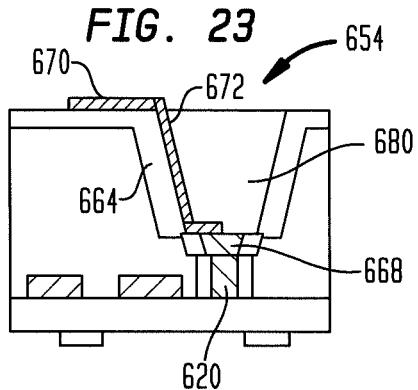
FIG. 23 is a sectional view illustrating a structure of microelectronic unit in accordance with a variation of an embodiment of the invention shown in FIG. 18.

FIG. 23 illustrates a variation of the embodiment illustrated in FIG. 19, in which the polysilicon region 620 is not removed prior to forming the metal layer. Rather, the polysilicon region 620 is allowed to remain in place when a metal layer 668 is formed in contact therewith, the metal layer 668 forming at least a portion of a conductive interconnect which extends along a wall of the dielectric layer 664 and is electrically connected with the rear contact 670. As in the above embodiment (FIG. 19), a portion 672 of the conductive interconnect which overlies the dielectric layer over the rear surface or within the first opening can be formed integrally with the rear contact 670. In particular embodiments similar to those shown and described above (FIGS. 20-21), a plurality of conductive interconnects can extend along one or more interior surfaces of an opening from a plurality of metal layers 668 connected to respective polysilicon regions 620.

In a particular embodiment, after forming the conductive interconnect, the opening 654 can be filled with a dielectric material 680. In this way, the dielectric material 680 can help to enhance mechanical strength of the structure, and may also provide insulation between respective conductive interconnects within an opening 654.

Figure 24:
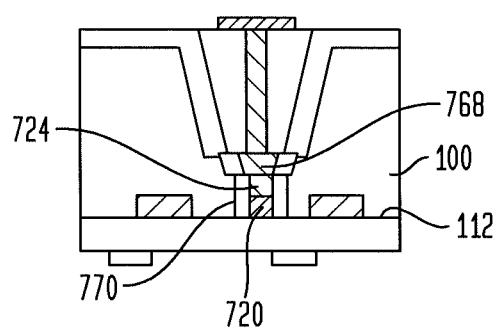
FIG. 24 is a sectional view illustrating a structure of microelectronic unit in accordance with a variation of an embodiment of the invention shown in FIG. 18.

As seen in FIG. 24, in a variation of the embodiment (FIG. 22), after removing polysilicon from region 720, a portion of the polysilicon may still remain therein. In one case, the remaining polysilicon may fill a portion of region 720 adjacent to the front surface 112 of the monocrystalline semiconductor region 100. Then, the metal layer 768 formed thereon contacts the polysilicon within the volume contained within the walls of the originally formed dielectric layer 770. In this way, a conductive structure is provided which extends from the front surface 112 through a remaining polysilicon portion 720 of the original via, and through a metal portion 724 contained within the walls surrounding the original polysilicon portion.

Figure 25:
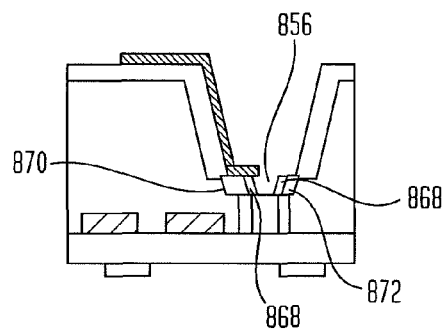
FIG. 25 is a sectional view illustrating a structure of microelectronic unit in accordance with a variation of an embodiment of the invention shown in FIG. 18.

FIG. 25 illustrates a further variation of the embodiment shown and described above relative to FIG. 19 in which the metal layer 868 within the second opening 856 conforms to a contour of the surface 870 of the second opening in the semiconductor region 100. As particularly shown, the metal layer 868 can at least substantially cover, and can fully cover interior surfaces of the dielectric layer 872 within the second opening 856.

Figure 26:
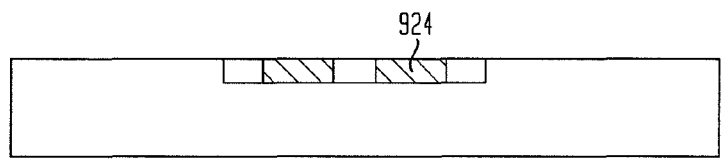
FIG. 26 is a sectional view illustrating a stage in a method of fabricating a microelectronic unit in accordance with a variation of the embodiment shown with respect to FIGS. 1-18.
Figure 27:
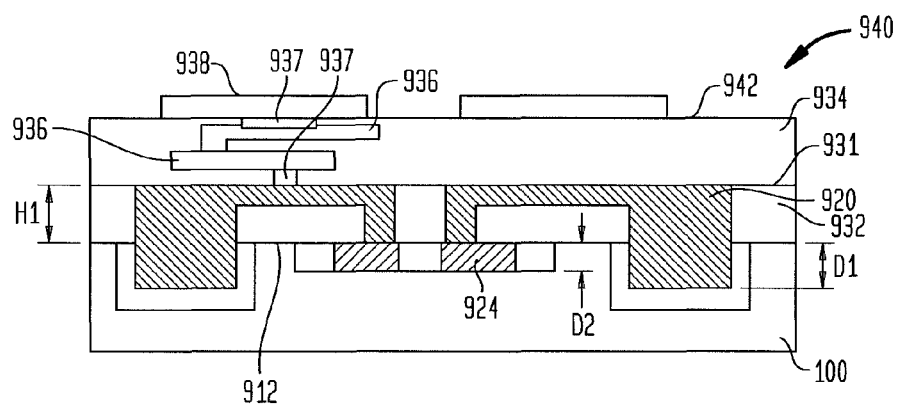
FIG. 27 is a sectional view illustrating another stage in a method of fabricating a microelectronic unit in accordance with a variation of the embodiment shown with respect to FIGS. 1-18.

Referring to FIGS. 26-27, further variations which are necessary to implement a "via middle" fabrication process will now be described. A via middle fabrication process differs from the above-described via first fabrication process in that high temperature processing used in forming the active circuit elements 924 (FIG. 26) is performed before forming conductive vias 920 (FIG. 27). As in the embodiments described above, the vias 920 extend to a depth D1 below the depth D2 to which active circuit elements 924 extend. The conductive vias 920 of this embodiment typically are formed after at least the high temperature processing used in forming the active circuit elements 924 is completed. However, the conductive vias 920 can be formed before forming wiring elements of the wafer, e.g., metal wiring lines 936 and vias 937 which connect the wiring lines within one or more metallization levels of the wafer within dielectric region 934 and before forming the conductive contacts 938, e.g., conductive pads, which are exposed at an exterior surface 942 of the wafer 940. Because the vias 920 do not need to withstand high temperature processing, they can be formed of a final metal. In one example, the vias 920 can include a metal such as nickel, copper or aluminum. In a particular embodiment, the vias 920 can be formed by plating. In another example, the vias can include tungsten or titanium, and can be formed by a PVD or CVD process, or combination thereof, for example.

As seen in FIG. 27, the conductive vias extend from a height H1 of a major surface 931 of a dielectric layer 932 above the front major surface 912 of the monocrystalline semiconductor region 100, the vias extending to a depth D1 which typically is below a depth D2 to which the active circuit elements 924 extend.

With the wafer 940 having the pre-existing via middle structure (FIG. 27), processing can now be performed as described above relative to FIGS. 5, 6 and 7 and 8. With respect to FIG. 9, holes 164 can now be formed in the dielectric layer 160. However, since the conductive vias 920 in the via middle process are formed of metal instead of a sacrificial material such as polysilicon which has greater electrical resistance, the metal within the vias 920 need not be removed. Therefore, the step of removing the polysilicon from the polysilicon regions is omitted, and instead the structure then is metallized to form conductive inter connects and rear contacts connected to the conductive vias, as shown and described above with respect to FIGS. 10-11. Further processing may also be conducted to form a front RDL as described above relative to FIG. 12. Processing can also be performed according to particular variations described above with respect to FIGS. 13-14, with respect to FIGS. 15-17, FIG. 18, FIGS. 19-20, FIGS. 19, 21, FIG. 22, or FIG. 25. In particular cases, the metal within the conductive vias 920 of a via middle starting structure can be copper, nickel or aluminum or a combination thereof.

In particular embodiments, The following patent applications incorporated by reference herein and filed on even date herewith disclose additional details, processes and structures which are pertinent to the disclosure herein, and which can apply to the structures and processes described below:

The vias and via conductors can be formed by processes such as those disclosed in greater detail in the co-pending, commonly assigned United States Patent Applications titled "MICROELECTRONIC ELEMENTS HAVING METALLIC PADS OVELYING VIAS," "METHOD OF FORMING SEMICONDUCTOR ELEMENTS USING MICRO-ABRASIVE PARTICLE STREAM," "NON-LITHOGRAPHIC FORMATION OF THREE-DIMENSIONAL CONDUCTIVE ELEMENTS," "ACTIVE CHIP ON CARRIER OR LAMINATED CHIP HAVING MICROELECTRONIC ELEMENT EMBEDDED THEREIN," and "MICROELECTRONIC ELEMENTS WITH POST-ASSEMBLY PLANARIZATION" filed of even date herewith, and in published US Patent Application Publication No. 20080246136, the disclosures of which are incorporated by reference herein.

Figure 28:
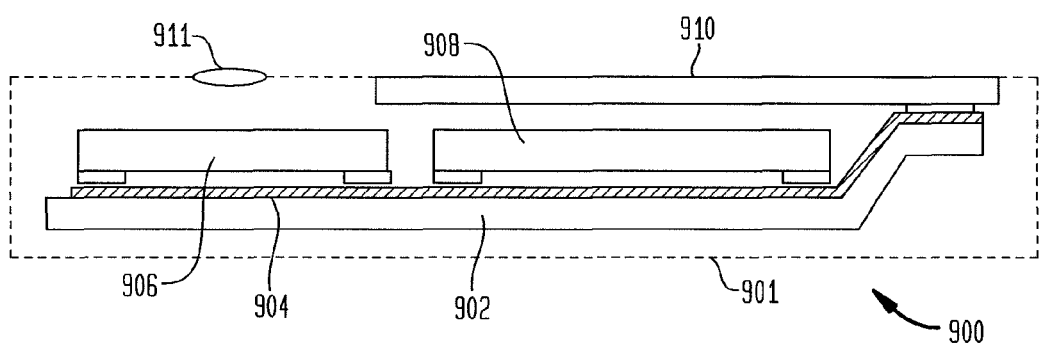
FIG. 28 is a schematic depiction of a system according to one embodiment of the invention.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 900 in accordance with a further embodiment of the invention includes a structure 906 as described above in conjunction with other electronic components 908 and 910. In the example depicted, component 908 is a semiconductor chip whereas component 910 is a display screen, but any other components can be used. Of course, although only two additional components are depicted in FIG. 28 for clarity of illustration, the system may include any number of such components. The structure 906 as described above may be, for example, a microelectronic unit 184A or a stacked microelectronic assembly 182 as discussed above in connection with FIG. 14, or any of FIGS. 18-27, or a structure 184A incorporating plural chips as discussed with reference to FIG. 14. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 28, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 906 includes a light-sensitive element such as an imaging chip, a lens 911 or other optical device also may be provided for routing light to the structure. Again, the simplified system shown in FIG. 28 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of the preferred embodiments should be taken by way of illustration rather than by way of limitation of the invention as defined by the claims.

The invention claimed is:

1. A method of fabricating a micro-electronic unit, comprising:

providing a microelectronic element including a semiconductor region of monocrystalline form, the microelectronic element having a front surface, a rear surface remote from the front surface, a front contact exposed at the front surface, an active circuit element adjacent to a front monocrystalline semiconductor region surface, a region of polycrystalline semiconductor material disposed in a trench insulated from the monocrystalline semiconductor region extending towards the rear surface, and a via disposed entirely between the front and rear surfaces of the microelectronic element, the front contact being electrically coupled with the region of polycrystalline semiconductor material through the via;

forming an opening extending from the rear surface partially through the monocrystalline semiconductor region and exposing the region of polycrystalline semiconductor material;

removing at least a portion of the polycrystalline semiconductor material through the opening; forming a conductive region at least partially replacing the removed polycrystalline semiconductor material; and forming a rear contact electrically coupled with the conductive region and exposed at the rear surface for electrical connection with a circuit element.

2. The method as claimed in claim 1, wherein forming the opening includes forming a first opening extending from the rear surface towards the front surface, forming a first layer within the first opening, then removing material of the polycrystalline semiconductor region through an opening in the first layer to form a second opening extending from the first opening toward the front surface, wherein the step of removing is performed by processing applied through the first and second openings.

3. The method as claimed in claim 1, wherein the microelectronic element further includes a dielectric region separating the polycrystalline semiconductor material region from the monocrystalline semiconductor region, wherein the step of forming the rear contact includes forming a conductive interconnect extending away from the conductive region at least within the opening, the rear contact being electrically connected with the conductive interconnect.

4. The method as claimed in claim 3, wherein the dielectric region includes an inorganic dielectric material and the step of forming the first layer includes depositing a polymeric material on at least an interior surface of the opening.

5. The method as claimed in claim 3, wherein the step of removing removes the polycrystalline semiconductor material selectively with respect to the dielectric region.

6. The method as claimed in claim 4, wherein the polymeric material is deposited electrochemically.

7. The method as claimed in claim 2, wherein the step of forming the first layer includes forming a dielectric layer lining the first opening by electrochemically depositing a polymer onto an interior surface of at least the first opening.

8. The method as claimed in claim 2, further comprising using photolithography to define an extent and a location of the opening in the first layer.

9. The method as claimed in claim 2, further comprising using a laser to define an extent and a location of the opening in the first layer.

10. The method as claimed in claim 2, further comprising removing the first layer, then forming a dielectric layer on interior surfaces of the first and second openings, and then forming conductive structure including the rear contact, the conductive structure being insulated from the monocrystalline semiconductor region by the dielectric layer.

11. The method of fabricating a micro-electronic unit as claimed in claim 2, wherein the step of forming the rear contact includes forming a dielectric layer on at least an interior surface of the second opening and then filling at least the second opening with a conductive material.

12. The method of fabricating a micro-electronic unit as claimed in claim 2, wherein the step of forming the rear contact includes forming a second dielectric layer within the second opening and then depositing a metal layer onto a surface of the second dielectric layer, the metal layer conforming to a contour of at least the second opening.

13. A method of fabricating a micro-electronic unit, comprising:

providing a microelectronic element including a semiconductor region of monocrystalline form, the microelectronic element having a front surface, a rear surface remote from the front surface, a front contact exposed at the front surface, an active circuit element adjacent to a front monocrystalline semiconductor region surface, a region of tungsten material disposed in a trench extending towards the rear surface, the region of tungsten material insulated from the semiconductor region by a dielectric material, and a via disposed entirely between the front and rear surfaces of the microelectronic element, the front contact being electrically coupled with the region of tungsten material through the via;

forming an opening extending from the rear surface partially through the monocrystalline semiconductor region and exposing the region of tungsten material;

removing at least a portion of the region of tungsten material selectively with respect to the dielectric material through the opening;

forming a conductive region at least partially replacing the removed tungsten material; and forming a rear contact electrically connected to the conductive region and exposed at the rear surface for electrical connection with a circuit element.

14. The method as claimed in claim 13, wherein forming the opening includes forming a first opening extending from the rear surface towards the front surface, forming a first layer within the first opening, then removing material of the tungsten region through an opening in the first layer to form a second opening extending from the first opening toward the front surface, wherein the step of removing is performed through the first and second openings.

15. The method as claimed in claim 13, wherein the microelectronic element further includes a dielectric region separating the tungsten material region from the semiconductor region, wherein the step of forming the rear contact includes forming a conductive interconnect extending away from the conductive region at least within the opening, the rear contact being electrically connected with the conductive interconnect.

16. The method as claimed in claim 15, wherein the dielectric region includes an inorganic dielectric material and the step of forming the first layer includes depositing a polymeric material on at least an interior surface of the opening.

17. The method as claimed in claim 14, wherein the step of removing removes the tungsten material selectively with respect to the dielectric region.

18. The method as claimed in claim 16, wherein the polymeric material is deposited electrochemically.

19. The method as claimed in claim 14, wherein the step of forming the first layer includes forming a dielectric layer lining the first opening by electrochemically depositing a polymer onto an interior surface of at least the first opening.

20. The method as claimed in claim 14, further comprising using photolithography to define an extent and a location of the opening in the first layer.

21. The method as claimed in claim 14, further comprising using a laser to define an extent and a location of the opening in the first layer.

22. The method as claimed in claim 14, further comprising removing the first layer, then forming a dielectric layer on interior surfaces of the first and second openings, and then forming conductive structure including the rear contact, the conductive structure being insulated from the semiconductor region by the dielectric layer.

23. The method of fabricating a micro-electronic unit as claimed in claim 14, wherein the step of forming the rear contact includes forming a dielectric layer on at least an interior surface of the second opening and then filling at least the second opening with a conductive material.

24. The method of fabricating a micro-electronic unit as claimed in claim 14, wherein the step of forming the rear contact includes forming a second dielectric layer within the second opening and then depositing a metal layer onto a surface of the second dielectric layer, the metal layer conforming to a contour of at least the second opening.

* * * * *